Figure 1:
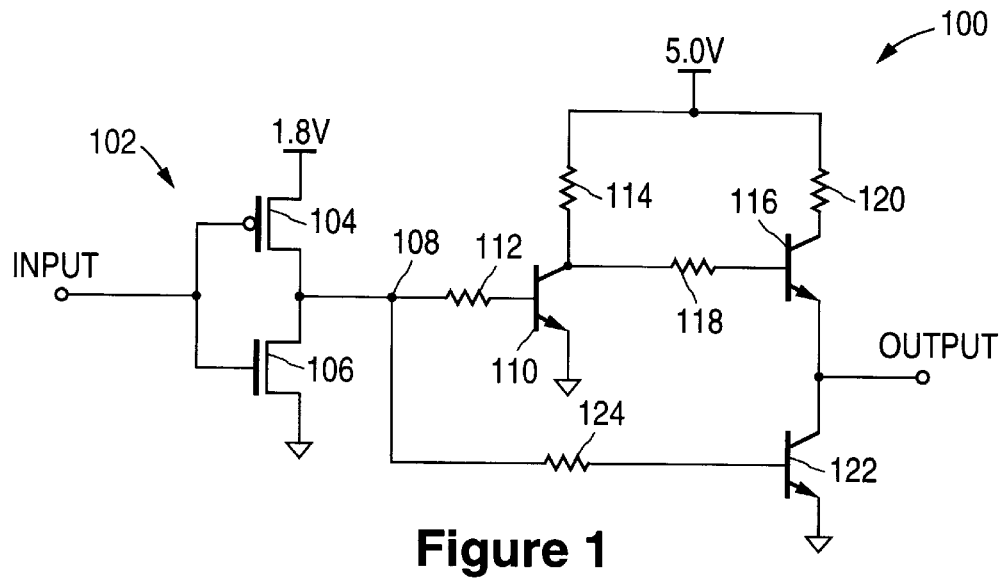

United States Patent [19]
Kapoor

[11] Patent Number: 6,121,794
[45] Date of Patent: Sep. 19, 2000

[54] HIGH AND LOW VOLTAGE COMPATIBLE CMOS BUFFER

[75] Inventor: Ashok Kapoor, Palo Alto, Calif.

[73] Assignee: National Semiconductor Corporation, Santa Clara, Calif.

[21] Appl. No.: 09/199,885

[22] Filed: Nov. 24, 1998

[51] Int. Cl.[7] ...................... H03K 19/0175; H01L 27/082
[52] U.S. Cl. ................. 326/81; 326/62; 257/592
[58] Field of Search ................... 326/62, 64, 68, 326/70–71, 75–77, 80–84, 89–90; 257/592

[56] References Cited

U.S. PATENT DOCUMENTS

| | | | |
|---|---|---|---|
| 3,959,671 | 5/1976 | Watson | 327/108 |
| 4,268,761 | 5/1981 | Suzuki et al. | 326/65 |
| 4,849,660 | 7/1989 | Hayashi et al. | 326/66 |
| 5,101,123 | 3/1992 | Ten Eyck | 326/66 |
| 5,254,887 | 10/1993 | Oguri | 326/66 |
| 5,576,635 | 11/1996 | Partovi et al. | 326/27 |
| 5,635,860 | 6/1997 | Westerwick | 326/81 |
| 5,731,713 | 3/1998 | Proebsting et al. | 326/71 |

*Primary Examiner*—Michael Tokar
*Assistant Examiner*—James A. Cho
*Attorney, Agent, or Firm*—Skjerven, Morrill and MacPherson LLP; Michael J. Halbert

[57] ABSTRACT

A CMOS buffer circuit isolates the low voltage CMOS logic gate from high voltage components on the chip and in the environment. The CMOS buffer circuit uses high voltage npn bipolar transistors with at least two P implants in the N-well serving as the base. The processing of the npn bipolar transistors uses an extra mask for the additional P implant, but advantageously does not require a thicker oxide growth. A CMOS output buffer circuit includes two high voltage npn bipolar transistors connected between the high voltage supply, e.g., 5.0 volts, and ground. The two bipolar transistors are driven by complementary signals generated by an inverter circuit or an emitter coupled logic circuit. The inverter circuit or emitter coupled logic circuit receive an input signal from the CMOS logic gate, which is connected between the low voltage supply, e.g., 1.8 to 3.3 volts, and ground. A CMOS input buffer circuit uses a transistor—transistor logic circuit configuration connected between the high voltage supply and ground to drive the CMOS logic gate, which again is connected between the low voltage supply and ground. A resistor connected between the input terminal of the CMOS logic gate and ground is configured such that the voltage across it exceeds the switching threshold of the CMOS logic gate.

16 Claims, 2 Drawing Sheets

HIGH AND LOW VOLTAGE COMPATIBLE CMOS BUFFER

FIELD OF THE INVENTION

The present invention relates to the field of integrated circuits and more particularly to buffer stages for complementary metal-oxide semiconductor ("CMOS") digital integrated circuits.

BACKGROUND

With the progress of technology, semiconductor device geometries are being continually scaled down. As the device geometries are scaled down, so are the thin isolation or oxide layers of the devices. Thus, to accommodate the smaller sized devices, the supply voltages have been necessarily reduced from the standard 5.0 volts to 3.3 volts, and in some instances smaller supply voltages are used, such as 2.5 volts and 1.8 volts.

Integrated circuits typically contain devices that are designed to use a standard 5.0 volt supply voltage as well as devices that are designed for the lower supply voltages. For example, CMOS logic gates in the core of the chip use a low supply voltage, while devices on the perimeter of the chip and external to the chip use a high supply voltage. Where high voltage devices are used in conjunction with low voltage devices, the low voltage devices may encounter over voltages causing excessive voltage stresses in the thin insulation or oxide layers thereby damaging the devices. Consequently, the low voltage devices used in the chip must be protected from the higher voltage supplies used by devices on and external to the chip.

High voltage buffers are used to interface the core circuitry in the chip, with the high voltage devices on the chip or the external environment. Conventionally, complicated circuitry or complicated device processing are used to generate high voltage buffers on low voltage circuitry. For example, a conventional method of protecting devices from over voltage is to grow a thick oxide layer on the device so that the device can tolerate a higher voltage. However, growing a thicker oxide on a device requires additional complicated processing, thus decreasing yield and increasing cost.

SUMMARY

A CMOS buffer circuit in accordance with an embodiment of the present invention isolates the low voltage CMOS logic gate from high voltage components. The CMOS buffer circuit includes an npn bipolar transistor having at least two P implants in an N− well, where the two P implants serve as a base. The npn bipolar transistor is connected to the high voltage supply. The CMOS logic gate is coupled to the npn bipolar transistor where the CMOS logic gate is connected to the low voltage supply. The processing of the npn bipolar transistor uses an extra mask for the additional P implant in the N− well. The additional P implant obviates the need to grow a thicker oxide layer.

The CMOS buffer circuit may be used as an output buffer that includes two npn bipolar transistors connected between the high voltage supply, e.g., 5.0 volts, and ground. The two bipolar transistors are driven by complementary signals generated by an inverter circuit or an emitter coupled logic circuit that receives the output signals form the CMOS logic gate. The CMOS logic gate is connected between the low voltage supply, e.g., 1.8, 2.5 or 3.3 volts, and ground.

The CMOS buffer circuit may also be used as an input buffer that also uses two npn bipolar transistors connected in a transistor—transistor logic configuration, and are connected between the high voltage supply and ground. The npn bipolar transistors drive the CMOS logic gate, which is connected between the low voltage supply and ground. A resistor connected between the input terminal of the CMOS logic gate and ground is configured such that the voltage across it exceeds the switching threshold of the CMOS logic gate.

BRIEF DESCRIPTION OF THE DRAWINGS

The above and other features, aspects, and advantages of the present invention will become better understood with regard to the following description, appended claims, and accompanying figures, where:

FIG. 1 is a schematic view of a voltage isolated CMOS output buffer;

FIG. 2 is a cross sectional view of a high voltage npn bipolar transistor with an additional P implant in the N− well serving as the base and used in the CMOS buffer circuits in accordance with an embodiment of the present invention;

FIG. 3 is a schematic view of a CMOS output buffer with a CMOS inverter;

FIG. 4 is a schematic view of a CMOS output buffer with an emitter coupled logic circuit to drive the npn bipolar transistors; and FIG. 5 is a schematic view of voltage isolated CMOS input buffer.

DETAILED DESCRIPTION

FIG. 1 is a schematic view of a voltage isolated CMOS output buffer 100 in accordance with one embodiment of the present invention. CMOS output buffer 100 isolates a CMOS logic gate 102 from the high voltage supply, shown as a 5.0 volt supply. The devices used in CMOS output buffer 100 are npn bipolar transistors with at least two P implants in the N− well where the P implants serve as the base. The npn bipolar transistors used in CMOS output buffer 100 are described below in reference to FIG. 2.

Output buffer 100 includes CMOS logic gate 102 with a p channel metal-oxide semiconductor ("PMOS") transistor 104 and an n channel metal-oxide semiconductor ("NMOS") transistor 106. The source of PMOS transistor 104 is connected to a first supply voltage, shown as a 1.8 volt supply voltage, and the drain is connected to the drain of NMOS transistor 106. The source of NMOS transistor 106 is connected to a second supply voltage, which is less than the first supply voltage, and hereinafter will be referred to as ground common, as illustrated in FIG. 1. The gates of PMOS transistor 104 and NMOS transistor 106 are both connected to the input terminal INPUT and the drains are both connected to node 108.

Node 108, which receives the output signal from CMOS logic gate 102 is connected to bipolar npn transistor 110 via resistor 112. The emitter of transistor 110 is connected to ground common, while the collector is connected via resistor 114 to a third supply voltage, shown in FIG. 1 as a 5.0 volt supply voltage. The collector of transistor 110 is also connected to the base of another bipolar npn transistor 116 through resistor 118. Thus, transistor 110 acts as an inverter logic gate.

The collector of bipolar transistor 116 is connected to the 5.0 volt supply voltage via resistor 120, while the emitter is connected to the collector of another npn bipolar transistor 122. The emitter of transistor 122 is connected to ground common and the base is connected to node 108 through a resistor 124. The collectors of transistors 116 and 122 are both connected to an output terminal OUTPUT.

While the present disclosure describes the high supply voltage as being 5.0 volts and the low supply voltage as being 1.8 volts, it should be understood that these voltages are exemplary and are not limiting. Thus, larger and smaller voltages may be used for the supply voltages if desired.

The CMOS logic gate 102 receives an input signal at terminal input. When the input signal is high, PMOS transistor 104 is turned OFF, the NMOS transistor 106 is turned ON, and thus the output signal from CMOS logic gate 102 at node 108 is pulled down to approximately second voltage level, e.g., ground common. Contrarily, when the input signal is low, PMOS transistor 104 is turned ON and the NMOS transistor 106 is turned OFF, and consequently, the output signal at node 108 is pulled up to approximately the first supply voltage level, e.g., 1.8 volts.

The npn transistor 116 is connected to node 108 through npn transistor 110, which act as an inverter logic gate. Thus, npn transistors 116 and 122, which are connected to node 108 respectively through npn transistor 110 and directly, receive complementary signals at their bases. When the signal at node 108 is low transistor 116 will receive a high signal via transistor 110 and transistor 116 will be turned ON. However, npn transistor 122 will receive the low signal and will be turned OFF. Consequently, when the signal at node 108 is low, the output signal at terminal OUTPUT will be pulled up to approximately the third supply voltage level, e.g., 5.0 volts. Conversely, when the signal at node 108 is high, transistor 116 will be turned OFF, transistor 122 will be turned ON, and the output signal at terminal OUTPUT will be pulled down to approximately ground common.

As shown in FIG. 1, CMOS output buffer 100 receives a low voltage level signal and produces an output signal that has a high voltage level. The low voltage CMOS gate 102 is used to drive high voltage npn bipolar transistors 116 and 122. However, the supply voltages used by the various devices are separate, which advantageously prevents over voltage conditions on the low voltage devices, e.g., CMOS logic gate 102.

Figure 2:
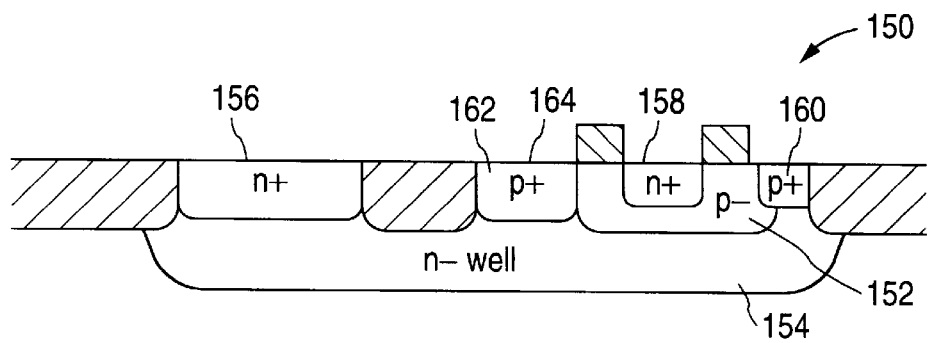

FIG. 2 shows a cross sectional view of a high voltage npn bipolar transistor 150 used in CMOS output buffer 100 as transistors 110, 116, and 122 in accordance with an embodiment of the present invention. The processing for npn bipolar transistor 150 is the same as for conventional bipolar transistors, however, with an additional P implant. The additional P implant forming P− region 152 is placed in the N− well region 154 prior to the N+ source and drain diffusions forming the collector 156 and emitter 158. The P− region 152 connects the two P+ regions 160 and 162 to form the base 164.

The processing prior to and after the additional P implant is the same as conventional bipolar transistor processing, which is well known by those of ordinary skill in the art. The additional P− region 152 is formed using a masked boron implant at a dosage of approximately $1 \times 10^{13}$ cm$^{-2}$ to $5 \times 10^{13}$ cm$^{-2}$ at an energy of approximately 5 keV to 40 keV. If $BF_2$ is used the energy may be scaled down to approximately 2 keV to 20 keV. The P− region 152 should have a higher concentration than the N− Well 154 and a lower concentration than the N+ collector/emitter regions 156 and 158. Once the P− region 152 is implanted, the remaining processing of bipolar transistor 150 is performed according to conventional methods.

Although high voltage npn bipolar transistor 150 requires an additional mask to implant P− region 152, there is no need to grow a thick oxide layer. Consequently, bipolar transistor 150 requires less processing than used in convention bipolar transistors that use a thick oxide layer to tolerate large voltages.

Figure 3:
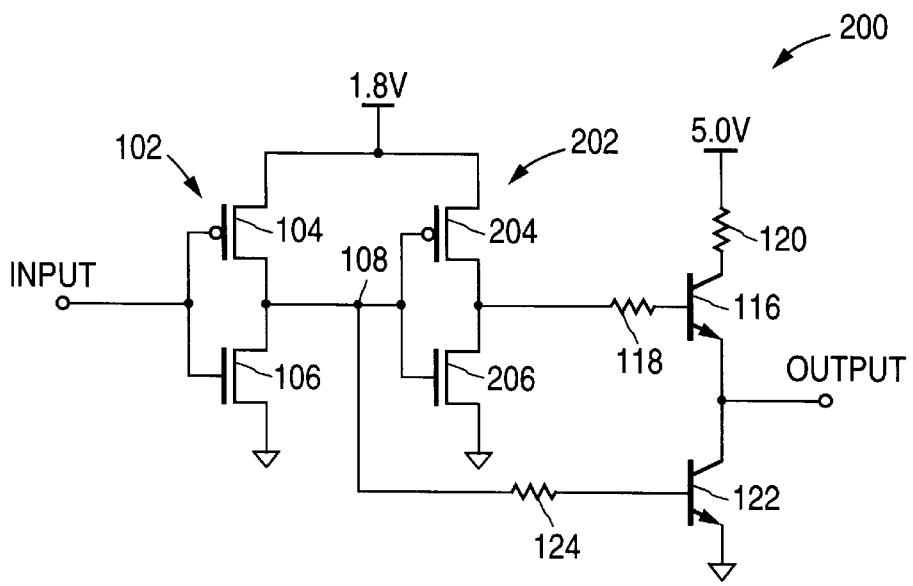

The high voltage npn bipolar transistor 150, shown cross sectionally in FIG. 2, is used as transistors 110, 116 and 122 in CMOS output buffer 100. Bipolar transistor 110, however, may be replaced by any type of inverter circuit, such as a CMOS inverter as shown in FIG. 3. FIG. 3 is a schematic view of CMOS output buffer 200, which is similar to CMOS output buffer 100 shown in FIG. 1, like designated elements being the same. CMOS output buffer 200 performs in a similar manner as CMOS output buffer 100, however, CMOS output buffer 200 uses a CMOS logic gate 202 to invert the signal at node 108. CMOS logic gate 202 is similar to CMOS logic gate 102, with a PMOS transistor 204 connected to the 1.8 supply voltage and an NMOS transistor 206 connected to ground common. Thus, CMOS logic gate 202 is connected to the low level supply voltage along with CMOS logic gate 102, while transistors 116 and 122 are connected between the high level supply voltage and ground common. Other examples of inverter circuits that may be used to drive transistor 116 include a PMOS inverter or NMOS inverter as are well known to those of ordinary skill in the art.

Figure 4:
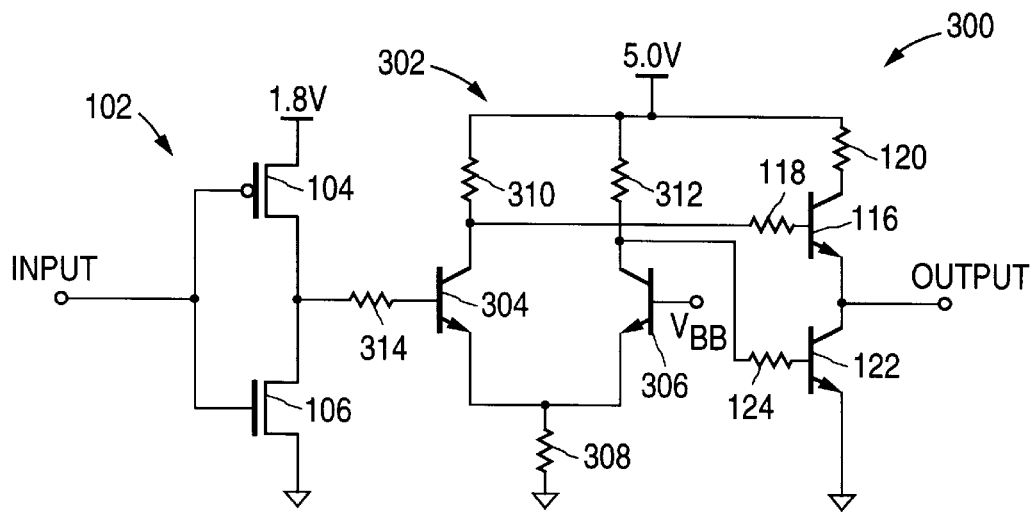

FIG. 4 is a schematic view of a CMOS output buffer 300 that uses an emitter coupled logic circuit ("ECL") 302 to generate complementary signals to drive bipolar transistors 116 and 122. Other than ECL 302, CMOS output buffer 300 is similar to CMOS output buffer 100, shown in FIG. 1, like designated elements being the same. ECL 302 includes two npn bipolar transistors 304 and 306, which have their emitters connected to ground common via resistor 308. The processing of transistors 304 and 306 is similar to high voltage npn bipolar transistor 150 shown in FIG. 2.

The collectors of transistors 304 and 306 are connected to the 5.0 volt supply voltage through respective resistors 310 and 312. The collector of transistor 304 is also connected to the base of transistor 116 while the collector of transistor 306 is connected to the base of transistor 122. The base of transistor 304 is connected to CMOS logic gate 102 through resistor 314 and the base of transistor 306 is connected to a bias voltage supply $V_{BB}$ used to control the swing point of ECL 302. Bias voltage supply $V_{BB}$ may be generated in any appropriate conventional manner, such as a voltage divider configured to generate a voltage at the desired swing point. The use of ECL 302 to drive transistors 116 and 122 is advantageous because it produces complementary signals with no delay between the signals.

Figure 5:
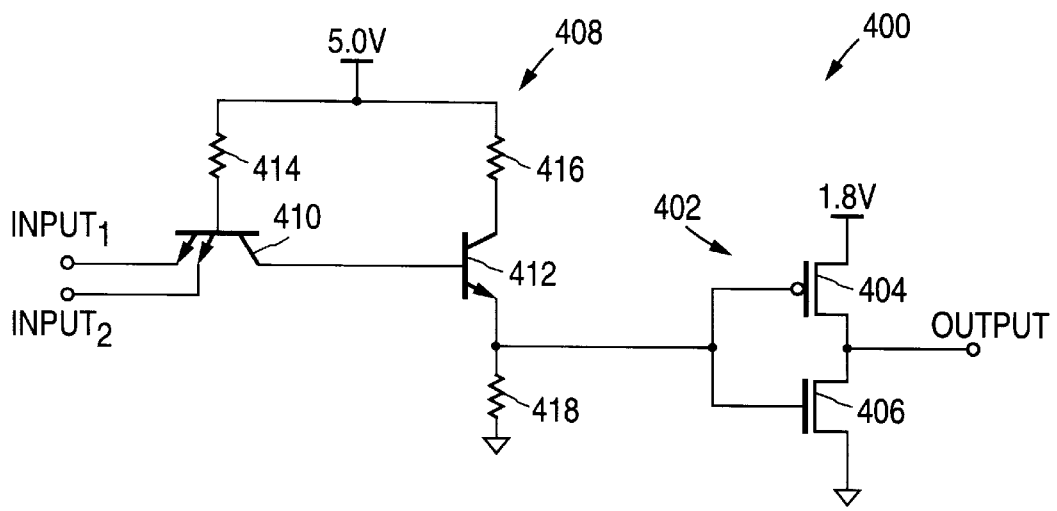

A CMOS input buffer in accordance with another embodiment of the present invention uses transistors with similar processing as high voltage npn bipolar transistor 150, shown in FIG. 2, and isolates the supply voltages between the buffer and the CMOS logic gate. FIG. 5 is a schematic view of voltage isolated CMOS input buffer 400 with CMOS logic gate 402 connected to output terminal OUTPUT. As shown in FIG. 5, CMOS input buffer 400 performs a NAND logic function, however it should be understood that any desired function may be performed by CMOS input buffer by appropriate configuration of the devices, as is well known to those of ordinary skill in the art. CMOS logic gate 402 includes PMOS transistor 404 and NMOS transistor 406 connected between a first supply voltage, shown as a 1.8 volt supply, and a second supply voltage, shown as ground common.

A transistor—transistor logic (TTL) gate 408 provides the input signal to CMOS logic gate 402. TTL gate 408 includes a double emitter npn bipolar transistor 410 and npn bipolar transistor 412. The processing of transistors 410 and 412 is similar to high voltage npn transistors 150 shown in FIG. 2, however, transistor 410 has an additional emitter. The emitters of transistor 410 are connected to the input terminals INPUT$_1$ and INPUT$_2$. It should be understood that transistor 410 is not limited to two emitters but may use additional emitters if desired. Thus, CMOS input buffer 400 is not limited to two input terminals.

The base of transistor 410 is connected to a second supply voltage, shown as a 5.0 volt supply, through resistor 414. The collector of transistor 410 is connected to the base of transistor 412. The collector of transistor 412 is connected to the 5.0 supply voltage through resistor 416 and the emitter is connected to ground common through resistor 418. The emitter of transistor 412 is also connected to CMOS logic gate 402. The values of resistors 414, 416, and 418 are chosen such that the voltage across resistor 418 exceeds the switching threshold of CMOS logic gate 402 at all temperatures when transistor 412 is conducting.

Thus, CMOS input buffer 400 uses high voltage npn bipolar transistors and isolates the supply voltages of the low voltage devices, i.e., the CMOS logic gate 402, and the high voltage devices, i.e., the TTL gate 408. Consequently, CMOS input buffer 400 is protected from damage caused by over voltage conditions.

Although the present invention has been described in considerable detail with reference to certain versions thereof, other versions are possible. For example, various inverters or other similar types of devices, such as ECLs, may be used to generate complementary signals to drive transistors 116 and 122. In addition, varitions may be designed by those skilled in the art based on the present disclosure without varying from the intended spirit or scope of the present invention. Also, some components are shown directly coupled to one another while others are shown coupled via intermediate components. In each instance the method of coupling establishes some desired electrical communication between two or more circuit nodes. Such coupling may often be accomplished using a number of circuit configurations, as will be understood by those of ordinary skill in the art. Therefore, the spirit and scope of the appended claims should not be limited to the description of the versions depicted in the figures.

What is claimed is:

1. An apparatus comprising:
   an npn bipolar transistor having at least two P implants in an N– well, said at least two P implants serve as a base, said npn bipolar transistor disposed between a first supply voltage and a second supply voltage, wherein said first supply voltage is at a higher voltage level than said second supply voltage; and
   a CMOS logic gate coupled to said npn bipolar transistor, said CMOS logic gate disposed between a third supply voltage and a fourth supply voltage, wherein said third supply voltage is at a higher voltage level than said fourth supply voltage;
   wherein said first supply voltage level is at a higher voltage level than said third supply voltage.
2. The apparatus of claim 1, further comprising:
   an inverter circuit coupled to an output terminal of said CMOS logic gate and coupled to said base of said npn bipolar transistor;
   said npn bipolar transistor having a collector coupled to said first supply voltage and an emitter coupled to an output terminal; and
   a second npn bipolar transistor having at least two P implants in an N– well, said at least two implants serve as a base, said output terminal from said CMOS logic gate being coupled to said base of said second npn bipolar transistor, said second npn bipolar transistor having an emitter coupled to said second supply voltage and a collector coupled to said emitter of said first npn bipolar transistor.
3. The apparatus of claim 1, further comprising:
   an emitter coupled logic circuit coupled to an output terminal from said CMOS logic gate and a bias voltage supply terminal, said emitter coupled logic circuit having a first output terminal coupled to said base of said npn bipolar transistor, and a second output terminal;
   said npn bipolar transistor having a collector coupled to said first supply voltage and an emitter coupled to an output terminal; and
   a second npn bipolar transistor having at least two P implants in an N– well, said at least two implants serve as a base, said base coupled to said second output terminal of said emitter coupled logic circuit, said second npn bipolar transistor having an emitter coupled to said second supply voltage and a collector coupled to said emitter of said first npn bipolar transistor.
4. The apparatus of claim 1, further comprising:
   a second npn bipolar transistor having at least two P implants in an N– well, said at least two implants serve as a base, said base coupled to said first supply voltage, said second npn bipolar transistor having at least one emitter coupled to a corresponding at least one input terminal, and having a collector coupled to said base of said npn bipolar transistor;
   said npn bipolar transistor having a collector coupled to said first supply voltage and an emitter coupled to an input terminal of said CMOS logic gate; and
   a resistor disposed between said emitter of said npn bipolar transistor and said second supply voltage, wherein said resistor has a voltage across it that exceeds the switching threshold of said CMOS logic gate.
5. The apparatus of claim 1, wherein said first supply voltage provides approximately 5.0 volts, said third supply voltage provides approximately 1.8 volts, and said second supply voltage and said fourth supply voltage are ground.
6. An apparatus comprising:
   a CMOS logic gate coupled between a first supply voltage and a second supply voltage wherein said second supply voltage is at a lower voltage level than said first supply voltage, said CMOS logic gate having an input terminal and an output terminal;
   means for generating a complementary signal coupled to said output terminal of said CMOS logic gate;
   a first npn bipolar transistor having a first terminal coupled to said means for generating a complementary signal, a second terminal coupled to a third supply voltage, and a third terminal coupled to an output terminal; and
   a second npn bipolar transistor having a first terminal coupled to said output terminal of said CMOS logic gate, a second terminal coupled to said third terminal of said first npn bipolar transistor, and a third terminal coupled to a fourth supply voltage, wherein said fourth supply voltage is at a lower voltage level than said third supply voltage;

wherein said third supply voltage is at a higher voltage level than said first supply voltage;

wherein said first npn bipolar transistor and said second npn bipolar transistor are high voltage npn bipolar transistors having at least two P implants in an N-well, said at least two P implants serve as a base.

7. The apparatus of claim 6, wherein said CMOS logic gate comprises:

a P channel MOSFET transistor having a first terminal coupled to said input terminal, a second terminal coupled to said first supply voltage, and a third terminal coupled to said output terminal; and an N channel MOSFET transistor having a first terminal coupled to said input terminal, a second terminal coupled to said second supply voltage, and a third terminal coupled to said output terminal.

8. The apparatus of claim 7, wherein said inverter circuit comprises a third npn bipolar transistor having a first terminal coupled to said output terminal of said CMOS logic gate, a second terminal coupled to said third supply voltage and said first terminal of said first npn bipolar transistor, and a third terminal coupled to said fourth supply voltage.

9. The apparatus of claim 7, wherein said inverter circuit is a CMOS inverter circuit comprising:

a P channel MOSFET transistor having a first terminal coupled to said input terminal, a second terminal coupled to said first supply voltage, and a third terminal coupled to said output terminal; and an N channel MOSFET transistor having a first terminal coupled to said input terminal, a second terminal coupled to said second supply voltage, and a third terminal coupled to said output terminal.

10. The apparatus of claim 6, wherein said means for generating a complementary signal is an inverter circuit.

11. The apparatus of claim 6, wherein said means for generating a complementary signal is an emitter coupled logic circuit having an input terminal coupled to said output terminal of said CMOS logic gate, a bias voltage input terminal coupled to a bias supply voltage, a first output terminal coupled to said first terminal of said first npn bipolar transistor, and a second output terminal coupled to said first terminal of said second npn bipolar transistor, said emitter coupled logic circuit being coupled between said third supply voltage and said fourth supply voltage.

12. The apparatus of claim 11, wherein said emitter coupled logic circuit comprises:

a third npn bipolar transistor having a first terminal coupled to said output terminal of said CMOS logic gate, a second terminal coupled to said third supply voltage and to said first terminal of said first npn bipolar transistor; and a third terminal coupled to said fourth supply voltage; and a fourth npn bipolar transistor having a first terminal coupled to a bias supply voltage; a second terminal coupled to said third supply voltage and to said first terminal of said second npn bipolar transistor, and a third terminal coupled to said fourth supply voltage.

13. The apparatus of claim 6, wherein said first supply voltage provides approximately 1.8 volts, said third supply voltage provides approximately 5.0 volts, and said second supply voltage and said fourth supply voltage are ground.

14. An apparatus comprising:

a first npn bipolar transistor having a first terminal coupled to a first supply voltage, a second terminal, and a third terminal coupled to at least one input terminal;

a second npn bipolar transistor having a first terminal coupled to said second terminal of said first npn bipolar transistor, a second terminal coupled to said first supply voltage, and a third terminal;

a resistor disposed between said third terminal of said second npn bipolar transistor and a second supply voltage, wherein said second supply voltage is at a voltage level that is less than said first supply voltage; and a CMOS logic gate having an input terminal coupled to said third terminal of said second npn bipolar transistor, and having an output terminal, said CMOS logic gate coupled between a third supply voltage and a fourth supply voltage wherein said fourth supply voltage is at a voltage level that is less than said third supply voltage and said third supply voltage is at a voltage level that is less than said first supply voltage;

wherein said resistor has a voltage across it that exceeds the switching threshold of said CMOS logic gate;

wherein said first npn bipolar transistor and said second npn bipolar transistor are high voltage npn bipolar transistors having at least two P implants in an N-well, said at least two P implants serve as a base.

15. The apparatus of claim 14, wherein said CMOS logic gate comprises:

a P channel MOSFET transistor having a first terminal coupled to said input terminal, a second terminal coupled to said first supply voltage, and a third terminal coupled to said output terminal; and an N channel MOSFET transistor having a first terminal coupled to said input terminal, a second terminal coupled to said second supply voltage, and a third terminal coupled to said output terminal.

16. The apparatus of claim 14, wherein said first supply voltage provides approximately 5.0 volts, said third supply voltage provides approximately 1.8 volts, and said second supply voltage and said fourth supply voltage are ground.

* * * * *